United States Patent [19]
Irons

[11] Patent Number: 6,147,382
[45] Date of Patent: Nov. 14, 2000

[54] SEMICONDUCTOR SWITCHING DEVICE WITH SEGMENTED SOURCES

[75] Inventor: Robert Charles Irons, Wiltshire, United Kingdom

[73] Assignee: Westcode Semiconductors Limited, United Kingdom

[21] Appl. No.: 08/953,050

[22] Filed: Oct. 17, 1997

[30] Foreign Application Priority Data

Dec. 12, 1996 [GB]  United Kingdom ................... 9625839

[51] Int. Cl.⁷ ............................. H01L 29/76; H01L 29/94
[52] U.S. Cl. .......................................... 257/341; 257/378
[58] Field of Search .................................. 257/329, 339, 257/341, 342, 378, 163, 164, 165, 166, 139, 144, 147, 152

[56] References Cited

U.S. PATENT DOCUMENTS

| | | | |
|---|---|---|---|
| 4,963,950 | 10/1990 | Chang et al. | 257/341 |
| 4,994,871 | 2/1991 | Chang et al. | 257/139 |
| 5,414,290 | 5/1995 | Bauer | 257/341 |
| 5,581,100 | 12/1996 | Ajit | 257/331 |
| 5,703,383 | 12/1997 | Nakayama | 257/341 |

FOREIGN PATENT DOCUMENTS

| | | | |
|---|---|---|---|
| 0 060 912 A1 | 9/1982 | European Pat. Off. | 257/139 |
| 0 252 236 | 1/1988 | European Pat. Off. | 257/341 |
| 0 405 138 | 1/1991 | European Pat. Off. | 257/341 |
| 0 405 138 A2 | 1/1991 | European Pat. Off. | 257/341 |
| 0 485 059 A2 | 5/1992 | European Pat. Off. | 257/139 |
| 0 543 313 | 5/1993 | European Pat. Off. | 257/341 |
| 0 623 960 | 11/1994 | European Pat. Off. | 257/341 |
| 0 690 512 A1 | 1/1996 | European Pat. Off. | 257/341 |
| 0 731 508 | 9/1996 | European Pat. Off. | 257/341 |
| 01 140773 | 6/1989 | Japan | 257/341 |
| WO 93/05535 | 3/1993 | WIPO | 257/341 |

OTHER PUBLICATIONS

*IEDM 84*, "Non–Latch–Up 1200V 75A Bipolar–Mode MOSFET with Large ASO", A. Nakagawa, H. Ohashi, M. Kurata, H. Yamaguchi, and K. Watanabe (1984), pp. 860—861.

Japanese Patent No. 07–50406, published on Feb. 21, 1995, Abstract—"Semiconductor Device with Self Arc–Extinguishing Function".

Japanese Patent No. 6–140626, published on May 20, 1994, Abstract—"Dual Gate MIS Gate Thyristor".

Japanese Patent No. 1–218065, published on Aug. 31, 1989, Abstract—"Gate Turn–Off Thyristor".

Japanese Patent No. 60–130168, published on Jul. 11, 1985, Abstract—"Semiconductor Device".

*Primary Examiner*—Steven H. Loke
*Attorney, Agent, or Firm*—Darby & Darby, P.C.

[57] ABSTRACT

A semiconductor switching device comprises a substrate of silicon of a first conductivity type provided at a first face with a doped region of opposite conductivity type and at a second, opposite face with strips of doped material of the opposite conductivity type therein to form base regions. More highly doped segmented regions of material of the opposite conductivity type lie wholly within the lateral bounds of the strips and are aligned therewith to include in each case a first margin of width on each side towards the boundaries of a strip. Further doped regions, of material of the first conductivity type, separate the segmented regions and include in each case a second margin of width on each side towards the boundaries of a strip. The first and second margins are for metal-insulator-silicon gated channels in the material of the opposite conductivity type between the further regions and the substrate, and the surfaces of the segmented regions and the further regions are provided with a common ohmically connected contact for use as a source terminal.

6 Claims, 5 Drawing Sheets

SEMICONDUCTOR SWITCHING DEVICE WITH SEGMENTED SOURCES

FIELD OF THE INVENTION

The present invention relates to semiconductor switching devices such as insulated gate bipolar transistor (IGBT) devices and emitter switched thyristor devices.

BACKGROUND OF THE INVENTION

To avoid the problem of parasitic thyristor latching, IGBT type devices must be made to very fine geometries with accurate alignment of the photolithographic processes used in their manufacture. This makes the production of such devices expensive in comparison to conventional bipolar devices which have much coarser structures. Any simplification which can reduce the need for alignment accuracy without sacrificing the resistance to latching is therefore of economic benefit.

A good over-view of the design of such structures can be found in "MODERN POWER DEVICES", B. Jayant Baliga, pp350–401. It can be learnt from this (pp397–398) that it is necessary to introduce a $p^+$ diffused region which must be accurately aligned with respect to the gate and that this is critical to the latching current density of the device as will be explained later. A modification of this structure to improve further the resistance to latching is known from A. Nakagawa, et al "Non latch-up 1200 volt bipolar mode MOSFET with large SOA", IEEE International Electron Device Meeting Digest, Abstract 16.8, pp860–861 (1984). While this modification improves the latching resistance it still retains the same processing requirement for the $p^+$ diffused region. Also, this structure substantially reduces the available channel width with a consequent increase in on-state voltage.

In a further prior art structure (EP-A-0 405 138 and EPA-0 690 512) an arrangement is disclosed in which higher concentration $p^+$ doped regions are introduced selectively into the p-base. These provide preferential paths for the transport of majority carriers (holes) to the ohmic source electrode without causing direct injection from the n-source region which may occur if the ohmic drop resulting from the passage of such current exceeds a small value, typically about 0.5V, at the junction between the n-source and p-base regions. The n-source is in the form of segmented strips, leaving gaps, typically greater than twice the length of the channel path, which accommodate the higher concentration regions. Again, the total channel width available in a given size of cell is considerably reduced according to the proportion of the gaps inserted in an n-source strip. In section, the relevant feature of the arrangement looks essentially the same as that of A. Nakagawa, et al. There are lines of segmented source strips at right angles to the gate, but the objective is to cause a decrease in the saturation current of the channel by reducing its length. For this purpose, if the spacing between the source strips is defined as D and the length of the channel in the direction of current flow is defined as L, then it requires that D>2L, effectively reducing the channel width. In the present invention, it is preferred that D<2L.

EP-A-0 060 912 relates to a method of switching a purely bipolar thyristor device using a MOS device in an external circuit. A device with cathode strips has a sheet-like base layer with no strip orientation while the contacts to the base layer appear to run parallel to the cathode strip except outside their ends. There is no parasitic thyristor action which needs to be suppressed.

WO 93/05535 discloses an IGBT structure but this is a trench structure with source strips parallel to the gate.

US-A-4 994 871 relates to a trench IGBT structure not a planar one. It describes source strips at right angles to the base (gate) strips but does not consider the widths of the strips nor the relationship D<2L. There may also be mentioned: U.S. Pat. No. 5,581,100 (a MOSFET, not an IGBT, with strips of a highly doped conductivity type in a low doped region of the same conductivity, not an opposite type); U.S. Pat. No. 4,963,950 (a trench not a planar structure and strips not at right angles to the gate); JP-A-7-050406 (a pure bipolar device and therefore having no gate or parasitic thyristor); JP-A-6-140626 (although connecting electrodes run, in part, at right angles to diffused base and source strips, the latter are parallel to each other); JP-A-1-218065; and JP-A-60-130168 (with a parallel base and emitter electrode strip structure, but the base layer being continuous and not strip-like).

SUMMARY OF THE INVENTION

According to the present invention there is provided a semiconductor switching device comprising:

a substrate of silicon of a first conductivity type provided at a first face with a doped region of opposite conductivity type and at a second, opposite face with strips of doped material of said opposite conductivity type therein to form base regions;

more highly doped segmented regions of material of said opposite conductivity type lying wholly within the lateral bounds of said strips and aligned therewith to include in each case a first margin of width on each side towards the boundaries of a strip; and further doped regions, of material of said first conductivity type, separating said segmented regions and including in each case a second margin of width on each side towards the boundaries of a strip, said first and second margins being for metal-insulator-silicon gated channels in the material of said opposite conductivity type between said further regions and said substrate, and the surfaces of said segmented regions and said further regions being provided with a common ohmically connected contact for use as a source terminal.

Preferably, the length of an edge of each of said segmented regions parallel to the direction of the said strips is not more than twice the width of said second margin.

Preferably, the separation of said segmented regions along a strip is not more than $15 \times 10^{-6}$m, such as not more than $10 \times 10^{-6}$m or $5 \times 10^{-6}$m.

Preferably, said further regions in one strip of material of said opposite conductivity type to another such strip define lines of further regions at right angles to said strips.

BRIEF DESCRIPTION OF THE DRAWINGS

The present invention will now be described, by way of example, with reference to the accompanying drawings, in which.

DESCRIPTION OF PREFERRED EMBODIMENTS

In prior art IGBT's, the parts of the device constituting the source region may consist of a sequence of strips with a metal-insulator-silicon (MIS) channel region running along one edge of each strip while the shorting between the source and a p-base which is required to prevent latch-up, i.e. self-sustaining thyristor action, is applied at the edge of the source electrode remote from the MIS channel region. By contrast, the device to be described according to the invention breaks each source strip into a series of segments separated by regions of exposed p-base surface so that, when a common ohmic contact is applied to the source and the exposed p-base areas, the MIS conduction channel lies along the two sides of rectangular source segments running parallel to the direction of the lines of the base strips while the shorting to the p-base lies along the perpendicular edges of the same segments.

A specific advantage of the device is that the masking required to define n-source segments consists of a fine line structure lying essentially perpendicular to the line structure of the mask used to define the p-base. The line of n-source segments now consists of corresponding sections of lines of the n-source mask self-selected by their interaction with the lines of the p-base mask, so that each segment of a line of n-source segments lying along the length of a p-base strip is an auto-selected part of a different perpendicular line component of the n-source mask. The auto-selection arises from the fact that the unwanted parts of the n-source mask lines are masked off by a polysilicon gate layer on which the deposition of the n-type source dopant has no practical effect. Thus, the lines of n-source segments which lie along the lines of the p-base are at right angles to the lines of the n-source mask which produced them by interaction with the existing lines of the p-base strips.

As a result, the device to be described according to the invention consists of a plurality of n-source segments in p-base strips, there being lines of n-source segments at right angles to the base strips. The spaces between the n-source segments are used as contact regions to the p-type base and short these regions to the n-source segments by a common ohmic contact. The purpose of this is to suppress parasitic thyristor action by introducing a short between its cathode (formed by the n-source segments) and its base (formed from the p-base strips). The effective resistance of this short is determined by the widths of the n-source segments in conjunction with the depths and profiles of the two diffusions which form the p- and n-type regions respectively., The objective which this suppression of the parasitic thyristor is intended to achieve is to improve the latching current density of the final IGBT in a convenient way, without a detrimental effect on the other electrical parameters of the device.

Figure 1:
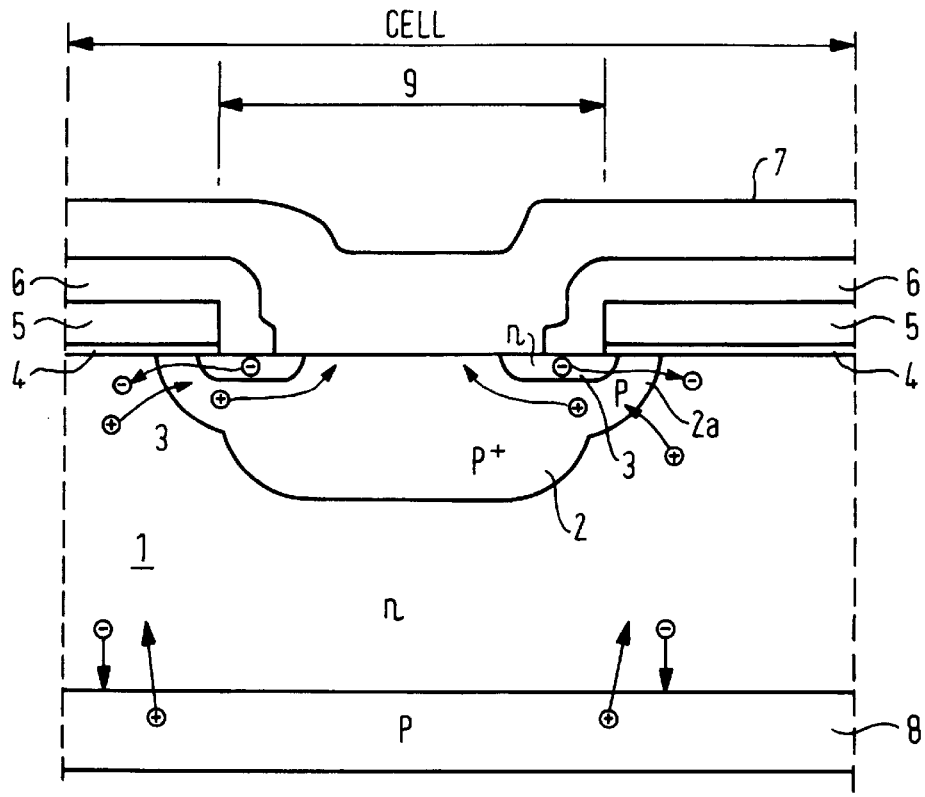
FIGS. 1 and 2 are sections through prior art devices.

Referring to FIG. 1, there is shown in vertical section part of a prior art arrangement according to Baliga. The device comprises in total a large number of such sections, each termed a cell, repeated in groups. The figure as shown may be expected to repeat itself from left to right many times within a group. The section shown consists of a substrate 1 of high resistivity n-type silicon into which have been diffused strips of p-type dopant so as to form p$^+$ regions 2.

Successive layers of thin gate oxide 4 and conductive polysilicon 5 have then been applied. In each cell, a window 9 aligned accurately with the edges of the original p$^+$ region 2 has been opened up in these two layers so that p- and n-type dopants can be introduced and diffused to form respectively lateral extensions 2a to the p$^+$-base region 2 (each extension being of a lower concentration than the former main part of the p$^+$-base region) and n-source regions 3 embedded in the base at its surface straddling the transition between its parts 2 and 2a. A thick CVD (chemical vapour deposited) oxide layer 6 is thereafter deposited over all and similarly windowed to expose in each cell the inward edges of the n-source 3 and the centre of the p$^+$-base strip region 2 lying therebetween. A contact metallisation as a source electrode 7 is applied to overlie the remaining oxide 6 and to contact and join all such exposed areas of each group of cells. The anode (sometimes called the collector) of the device consists of a p-layer 8 formed at the lower face of the n-substrate 1 to which a counter-electrode for main current flow is attached. In operation, in each cell, with the anode held positive and the n-source earthed, a small potential applied to the conductive polysilicon layer 5 stimulates the formation of an inversion channel in the surface of the extended part 2a of the base which creates a conductive path for electrons from the n-source 3 to the n- substrate 1. The device now behaves like a p-i-n diode and the anode player 8 injects holes into the n- substrate 1. These are duly collected into the p$^+$-base strip region 2 through which they flow towards the source electrode 7. In order to avoid the presence of the hole current causing direct injection from the n-source 3 into the p$^+$-base strip region 2 and the consequent risk of thyristor latching, it is necessary that the ohmic potential arising therefrom shall not exceed a small value of about 0.5V immediately adjacent the junction between these two regions. In other words, the resistive impediment to the flow of hole current in the base should be kept as low as possible.

Figure 2:
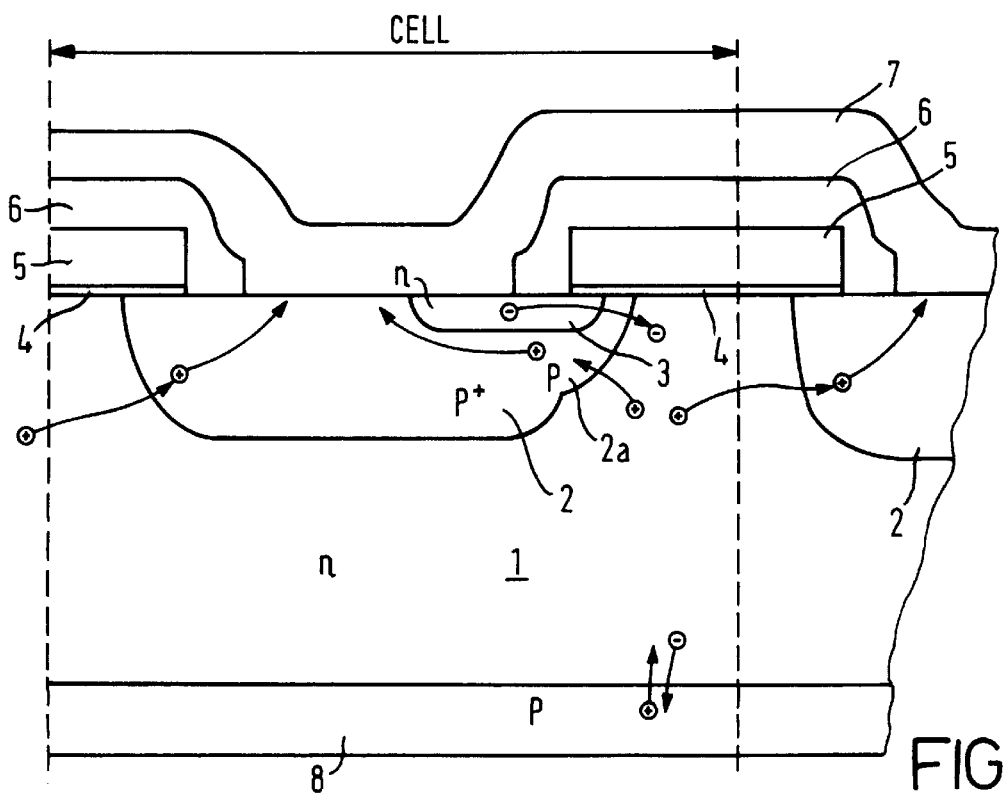

Referring now to FIG. 2, a modification as disclosed by A. Nakagawa, et al to the structure of FIG. 1 uses only one edge of the p$^+$-base strip region 2 to form a channel path. Since the pattern repeats, the opposite edge of the next p$^+$-base strip region 2 requires no extended base region 2a and has no corresponding n-source. The hole current arriving from the anode 8 can therefore flow on each side of the n-source region 3 as shown by the arrows. However, the penalty for this improvement is a reduction in the available channel width resulting in an increased channel current density for a given total current.

The further modification disclosed by EP-A-0 690 512 results in a structure which, in any given sectional view, appears as either a right- or left-handed version of FIG. 2, the handedness alternating along the length of a p$^+$-base strip region. It therefore suffers essentially the same penalty as the A. Nakagawa, et al device in terms of space efficiency.

Figure 3:
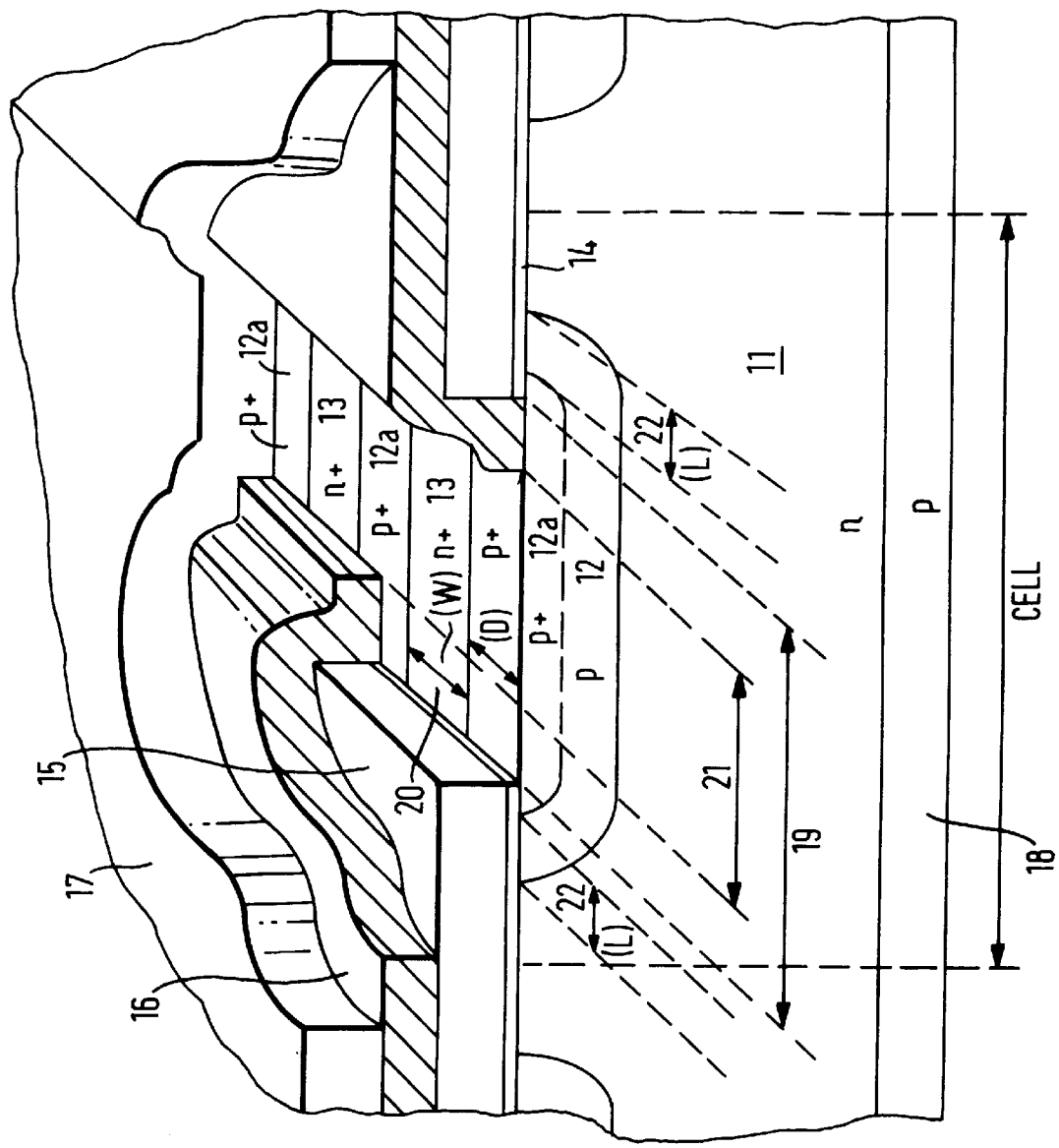
FIGS. 3 is a cut-away section through an example of a device according to the present invention.

Referring to FIG. 3, there is shown in cut-away section a general view of an example of a device according to the invention. A substrate wafer 11 of high resistivity n-type silicon has diffused into it at a first (lower) face a p-type dopant to form an anode 18. At the second (upper) face is grown a thin gate oxide layer 14 which is then overlaid by a layer 15 of conductive polysilicon. The second face is then masked and the polysilicon and oxide layers 15 and 14 selectively etched away to form parallel strip-like windows 19 exposing the substrate surface. In each window 19, a p-type dopant is implanted by high energy impact and diffused into the exposed surface to form p-base strips 12. The diffusion process causes each of the p-base strips 12 to extend laterally under the edges of the polysilicon and oxide masking layers 15 and 14 by an extent similar to its depth into the substrate. A subsequent mask is used to define and expose further strips 20 running perpendicular to the orientation of the p-base strips 12 into which are similarly implanted an n-type dopant of specific concentration, e.g. about $3 \times 10^{15}$ atoms per cm$^2$. The subsequent mask is next removed and the whole second surface implanted with a p-type dopant of lesser specific concentration than the n-type implant, e.g. about $3 \times 10^{14}$ atoms per cm$^2$. The two implanted species are now diffused simultaneously to form respectively n$^+$-source segmented regions 13 by over-doping the previous p-type diffusant and more heavily doped p$^+$ segmented regions 12a of the p-base strips 12 by reinforcing the previous diffusant. It should be noted that, although the p-dopant implant has been made over the whole second surface, it is effective only in the exposed surface areas of the p-base strips 12 which have not been implanted with n-dopant as the higher concentration of the latter renders it dominant. Then a thick dielectric layer 16 of CVD oxide (typically SiO$_2$) is deposited over all of the second face and photolithographically masked and etched to expose in a window 21 (narrower than previously defined for the p-base strip 12), the centre parts only of the surfaces of the n$^+$-source segmented regions 13 and the reinforced p$^+$-base segmented regions 12a lying along the axes of the p-base strips 12. Finally, there is deposited a layer of metallisation as a unified contact electrode 17 for the n$^+$-source regions 13 and the reinforced p$^+$-base regions 12a. It may be noted that contact to the conductive polysilicon layer 15 which acts as a gate to control channel regions 22 of the device is made peripherally outside the area shown in the figure and may be effected in any suitable manner.

Figure 4:
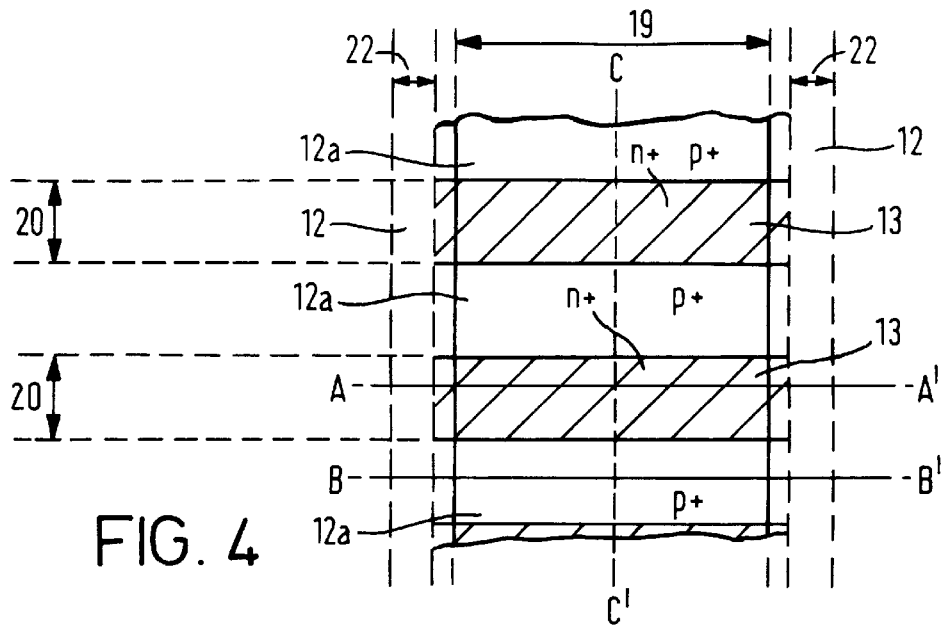
FIGS. 4–7 show the geometry of the device of FIG. 3.
Figure 5:
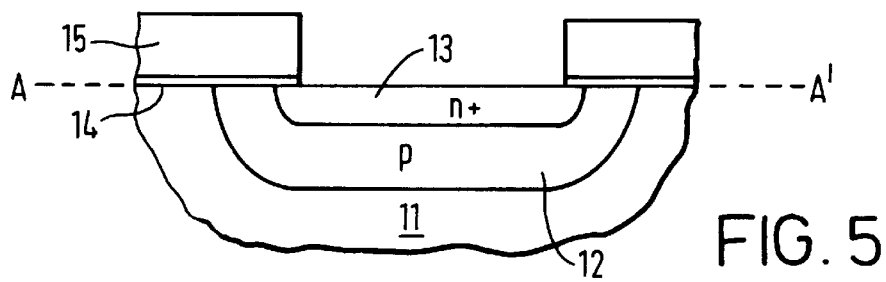
Figure 6:
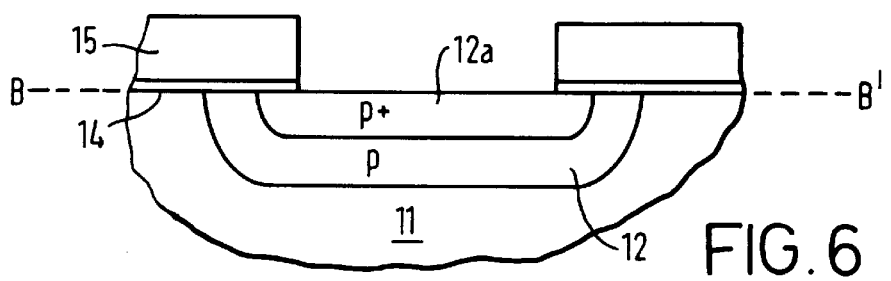
Figure 8:
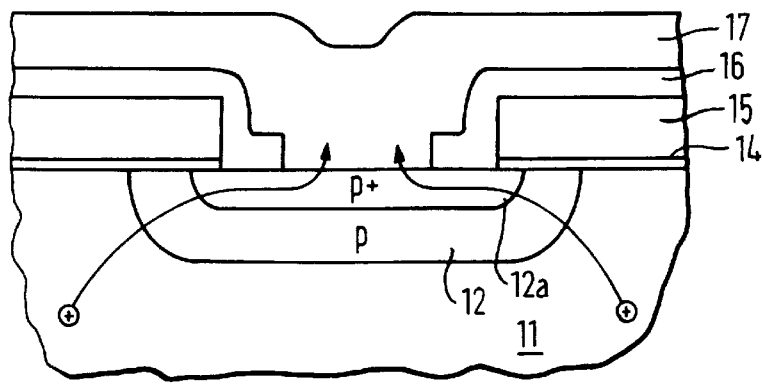
FIGS. 8–10 show the directions of current flow in the device.
Figure 9:
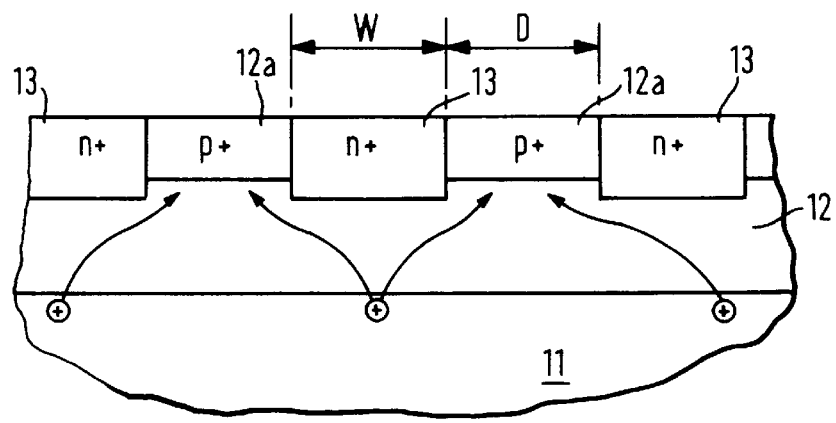
Figure 10:
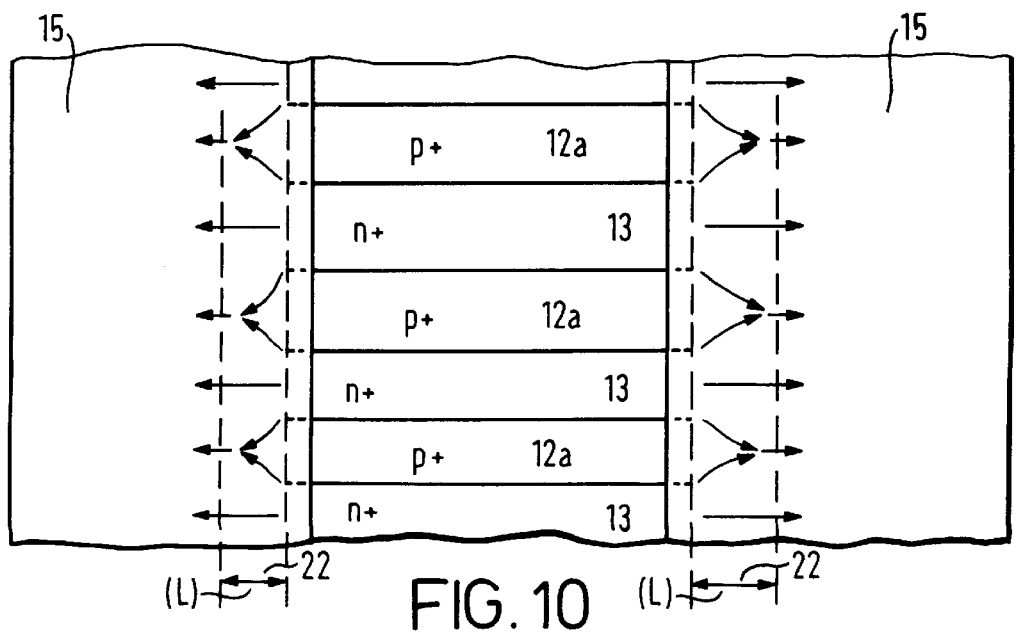

The geometry of the structure may be better understood by reference to FIGS. 4 to 7. FIG. 4 shows a plan view of the surface of part of an example of a device according to the present invention before the gate dielectric and source metallisation layers have been applied; FIG. 5 shows a section through A–A' of FIG. 4; FIG. 6 shows a corresponding section through B–B'; and FIG. 7 a section through C–C', of FIG. 4. The description above relating to FIG. 3 serves therefore to describe these figures also. FIGS. 8–10 show the directions of the majority current flow in the p-base regions 12 and 12a.

FIG. 8 shows the same basic section B–B' of FIG. 6 but with the addition of the CVD oxide dielectric layer 16 and the source electrode layer 17. The arrows trace the path taken by the majority hole current arriving in a p-base strip 12 from the n-type substrate 11 in the vicinity where the section is cut. The flow of this current is only briefly through the thickness of the p-base strip 12 and then continues laterally in the reinforced p$^+$ segmented region 12a of relatively high conductivity where it runs parallel to the source-base junction and hence no significant bias is caused to occur across the source-base junction.

Figure 7:
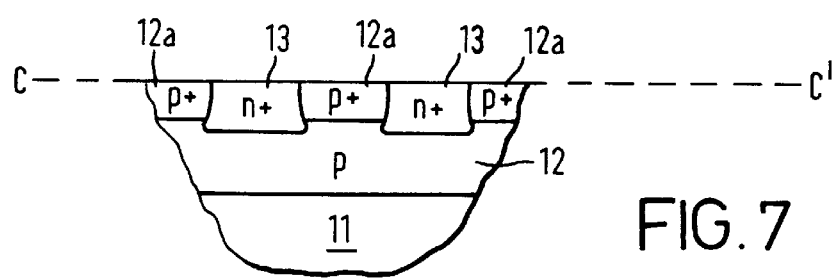

FIG. 9 is essentially as the section C–C' of FIG. 4 shown in FIG. 7 and the arrows trace the path taken by the majority hole current arriving in a p-base strip 12 from the n-type substrate 11 in the vicinity where this section is cut. The lateral path (i.e. horizontal displacement) taken by the majority current which is parallel to the axis of the p-base strip 12 is never more than half the width of one segment of the n$^+$-source region, dimension W in FIG. 9. Dimension W (the separation of the segmented p$^+$- regions 12a along p-base strips 12) is preferably not more than 15×10$^{-6}$m, such as not more than 10×10$^{-6}$m or 5×10$^{-6}$m. This is an easily controlled dimension, not dependent on mask registration accuracy.

FIG. 10 (in which the arrows show the directions of electron flow in the channel regions 22) shows a combination in plan view of the majority carrier current flows shown in FIGS. 8 and 9. In a strip 12 the segmented regions 12a and the n$^+$-source regions 13 each have a margin of width on each side towards the boundaries of the strip (the margin of width of each n$^+$ source region 13 on each side being L). In the present case, the margins of width for regions 12a and 13 are substantially the same. The length of the edge of each of regions 12a parallel to the direction of its strip (i.e. its width D) is not more than twice the margin of width (L) for regions 13. The effective path length of each channel region 22 is L and the effective total useful width of each channel region 22 in the device will be greater than the sum of the widths W of the n$^+$-source segmented regions 13 because of the divergence of the electron current from the sides of each n$^+$-source segmented region 13 as it flows through the channel to the n-substrate 11.

Figure 11:
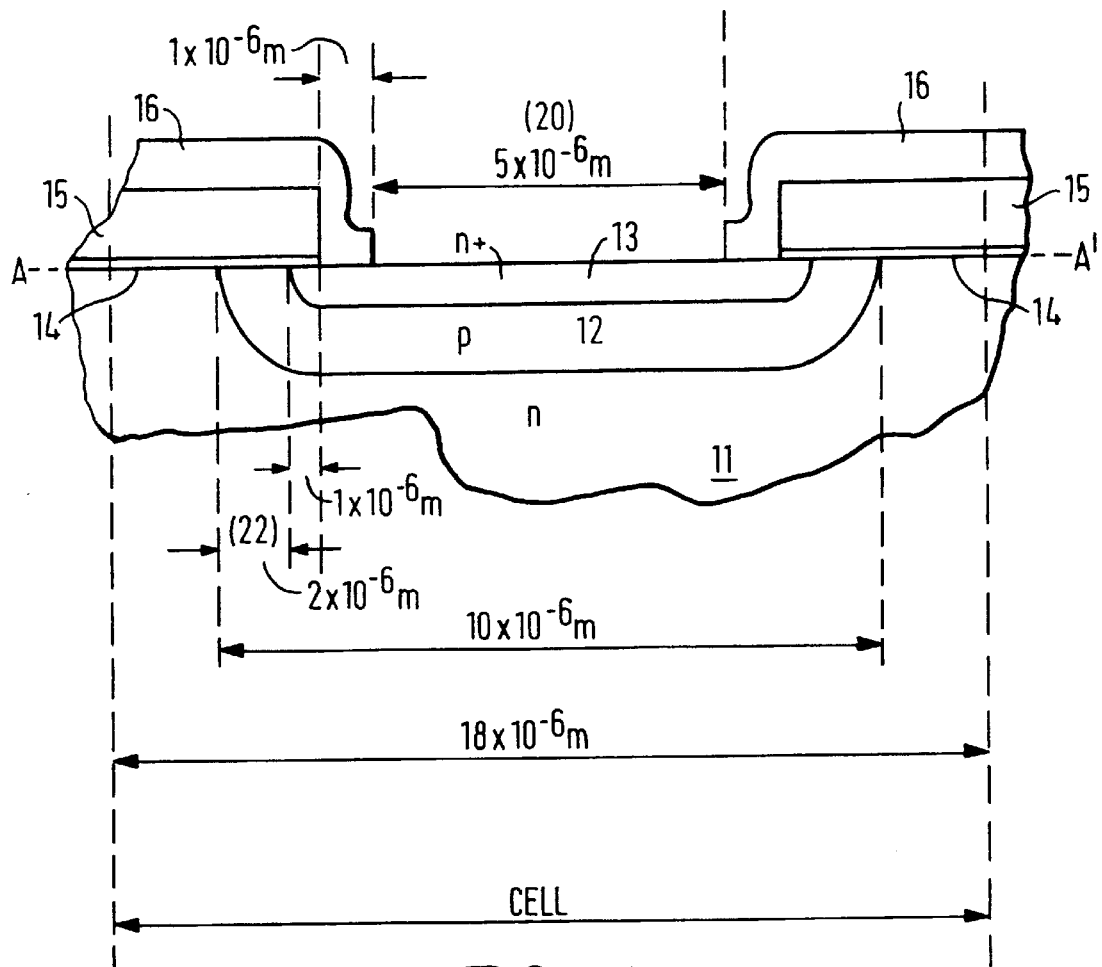
FIGS. 11 and 12 are dimensioned versions of FIGS. 8 and 9.
Figure 12:
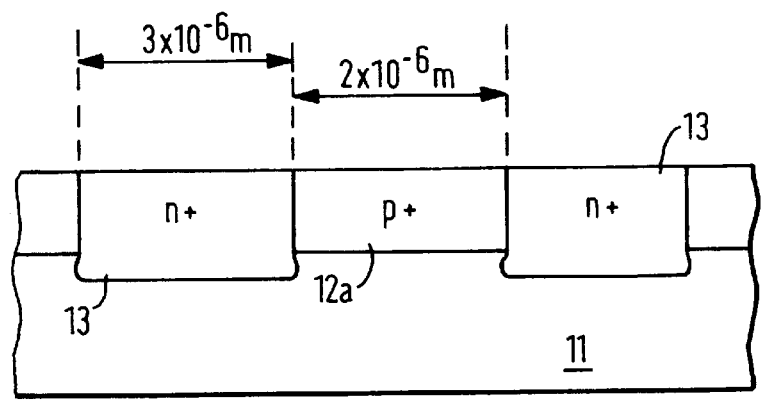

FIGS. 11 (a dimensioned version of FIG. 8) and 12 (a dimensioned version of FIG. 9) give examples of typical (but not exclusive) dimensions for a structure according to the invention with reference numerals as used for FIG. 3.

An advantage of the structure and process sequence is that unlike prior art planar devices, the respective widths of the p-base strips 12, the p$^+$ reinforced segmented regions 12a of the p-base strips 12 and the n$^+$ source segmented regions 13 are each defined by the same window 19 in the oxide/polysilicon layers. The only alignment required for the lines of n$^+$-source segmented regions 13 running perpendicular to the p-base strips 12 is at their extreme ends which can be arranged to fall on a wider, inactive part of the p-base, thereby permitting a relaxed tolerance of registration. The extent of the p$^+$ reinforced segmented regions 12a of the p-base is fully defined by the combination of the first p-base strip window and the n-source mask.

A further advantage is a good resistance to parasitic thyristor latching with less loss of effective active device area or other performance compromises than in the prior art designs discussed above.

A yet further advantage is that since the p$^+$ contact region of the p-base does not run parallel to the edge of the gate, the window in the gate oxide does not have to accommodate the width of the p$^+$ region diffusion (including its lateral diffusion length around the edge of the window) thus permitting the gap between the two channel regions to be reduced compared to the prior art. This in turn enables the overall cell width to be less, thereby improving the proportion of active to inactive area of the device.

This source side structure can be combined with any of the known anode structures currently used be they punch-through or non-punch-through, n- buffer, p- anode or shorted anode designs.

The treatment of the p-base diffusion also influences the dimensions shown in FIG. 11. The constraints on this p diffusion are that the total charge under the n$^+$-source be sufficient to stop punch-through of the depletion region in the blocking state. At the same time the concentration at the p-base/n$^+$-source intercept must be low enough to ensure an appropriate threshold voltage for channel formation. The worst case for dimensioning the device occurs when the peak dopant concentration in the p-base is located at the surface. In contrast, any means of putting the peak dopant concentration subsurface, for example a higher energy implant or an opposing threshold adjusting implant, allows for a greater n$^+$-source width, since the sheet resistance under the source can be lowered to allow for a higher hole current before the onset of latching.

The process sequence n-source implant/p$^+$ implant can be commuted provided that the p$^+$ implant is masked and the implanted p$^+$ charge is greater than the implanted n$^+$-source charge. The p$^+$ implant is then masked and the n$^+$-source is self-aligned (i.e. determined by the combination of the first p-base strip mask and the p$^+$ implant mask) putting the p$^+$ reinforced region deeper rather than shallower (as shown in FIG. 7) compared to the n$^+$-source.

Although the present invention has been described by way of example with reference to an IGBT device, it may also be applied to an emitter switched thyristor device for example.

What is claimed is:

1. A semiconductor switching device comprising:

a substrate of silicon of a first conductivity type provided at a first face with a first doped region of a second conductivity type opposite to that of said first conductivity type and at a second, opposite face with strips of doped material of said second conductivity type therein to form base regions;

segmented regions of material of said second conductivity type lying wholly within the lateral bounds of each of said strips and aligned therewith to include in each case a first margin of width on each side of each of the segmented regions towards each of the boundaries of a corresponding strip, said segmented regions being more highly doped than said strips; and further doped regions, of material of said first conductivity type, separating said segmented regions and including in each case a second margin of width on each side of each of the further doped regions towards each of the boundaries of a corresponding strip, said first and second margins being for a metal-insulator-silicon gated channel in the material of said second conductivity type between each of said further regions and said substrate and the surfaces of said segmented regions and said further regions being provided with a common ohmically connected contact for use as a source terminal, wherein the length of an edge of each of said segmented regions parallel to a boundary direction of the corresponding one of said strips is not more than twice the width of said second margin.

2. A device according to claim 1, wherein the separation of said segmented regions is not more than $15 \times 10^{-6}$m.

3. A device according to claim 2, wherein said separation is not more than $10 \times 10^{-6}$m.

4. A device according to claim 3, wherein said separation is not more than $5 \times 10^{-6}$m.

5. A device according to claim 1, wherein each of said further doped regions of said first conductivity type are elongated in a direction at right angle to said strip.

6. A device according to claim 1, wherein said substrate is of n-type silicon, said first doped region at a first face is p-type, said strips are p-regions, said segmented regions are $p^+$-regions and said further regions are $n^+$-regions.

* * * * *

UNITED STATES PATENT AND TRADEMARK OFFICE
CERTIFICATE OF CORRECTION

PATENT NO. : 6,147,382
DATED : November 14, 2000
INVENTOR(S) : Robert Charles Irons Page 1 of 1

It is certified that error appears in the above-identified patent and that said Letters Patent is hereby corrected as shown below:

<u>Column 8,</u>
Lines 17-19, delete claim 5 in its entirety and insert therefor;
-- 5. A device according to claim 1, wherein said further doped regions of said first conductivity type are in lines at right angles to said stripes. --.

Signed and Sealed this

Twenty-sixth Day of November, 2002

*Attest:*

*Attesting Officer*

JAMES E. ROGAN
*Director of the United States Patent and Trademark Office*